(12) United States Patent
Kumagawa et al.

(10) Patent No.: US 9,112,482 B2
(45) Date of Patent: Aug. 18, 2015

(54) RECEIVER

(71) Applicant: Panasonic Corporation, Osaka (JP)

(72) Inventors: Masahiro Kumagawa, Hyogo (JP); Yoshifumi Hosokawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/394,731

(22) PCT Filed: Dec. 25, 2013

(86) PCT No.: PCT/JP2013/007557
§ 371 (c)(1),
(2) Date: Oct. 15, 2014

(87) PCT Pub. No.: WO2014/132315
PCT Pub. Date: Sep. 4, 2014

(65) Prior Publication Data
US 2015/0070055 A1 Mar. 12, 2015

(30) Foreign Application Priority Data

Feb. 27, 2013 (JP) ................................. 2013-037562

(51) Int. Cl.
*H03K 5/00* (2006.01)
*H04B 1/26* (2006.01)
*H03K 5/007* (2006.01)

(52) U.S. Cl.
CPC ............ *H03K 5/00006* (2013.01); *H03K 5/007* (2013.01); *H04B 1/26* (2013.01)

(58) Field of Classification Search
CPC .... H03K 5/00006; H03K 5/007; H04L 27/06; H04L 27/063; H04L 27/152; H04L 27/1563; H04L 25/00; H04B 1/005
See application file for complete search history.

(56) References Cited

U.S. PATENT DOCUMENTS

| 6,711,397 | B1 * | 3/2004 | Petrov et al. .................. 455/324 |
| 2007/0018707 | A1 * | 1/2007 | Rajagopal et al. ............. 327/231 |
| 2012/0281718 | A1 * | 11/2012 | Kaho et al. ..................... 370/498 |

FOREIGN PATENT DOCUMENTS

| EP | 0 546 806 A1 | 6/1993 |
| JP | 6-21857 A | 1/1994 |

(Continued)

OTHER PUBLICATIONS

Afsahi et al., "A Low-Power Single-Weight-Combiner 802.11abg SoC in 0.13 um CMOS for Embedded Applications Utilizing an Area and Power Efficient Cartesian Phase Shifter and Mixer Circuit," IEEE Journal of Solid-State Circuits, 43(5):1101-1118, May 2008.

(Continued)

*Primary Examiner* — Leon Flores
(74) *Attorney, Agent, or Firm* — Seed IP Law Group PLLC

(57) ABSTRACT

A received is disclosed that is capable of improving reception sensitivity while avoiding an increase in circuit scale. The receiver includes: a multi-phase local oscillation signal generating section that generates a plurality of local oscillation signals of different phases; a phase selection signal generating section that generates a phase selection signal used to select a baseband signal of a predetermined phase based on a detection result of a reception level of a high-frequency signal; and a frequency converter that frequency-converts the high-frequency signal based on the plurality of local oscillation signals, that generates a plurality of baseband signals of different phases, and that selects a baseband signal from among the plurality of baseband signals based on the phase selection signal.

6 Claims, 20 Drawing Sheets

(56) References Cited

FOREIGN PATENT DOCUMENTS

| | | |
|---|---|---|
| JP | 11-150497 A | 6/1999 |
| JP | 2000-252898 A | 9/2000 |
| JP | 2000-307493 A | 11/2000 |
| JP | 2004-254200 A | 9/2004 |
| JP | 2005-51594 A | 2/2005 |
| JP | 2008-72564 A | 3/2008 |

OTHER PUBLICATIONS

International Search Report dated Apr. 1, 2014, for corresponding International Application No. PCT/JP2013/007557, 4 pages.

* cited by examiner

| | TERMINAL A | TERMINAL B | TERMINAL C | TERMINAL D | TERMINAL E | TERMINAL F |
|---|---|---|---|---|---|---|
| CASCODE AMPLIFICATION SECTION 16-000 | P1-315 | P1-000 | P1-045 | P1-135 | P1-180 | P1-225 |
| CASCODE AMPLIFICATION SECTION 16-045 | P1-000 | P1-045 | P1-090 | P1-180 | P1-225 | P1-270 |
| CASCODE AMPLIFICATION SECTION 16-090 | P1-045 | P1-090 | P1-135 | P1-225 | P1-270 | P1-315 |
| CASCODE AMPLIFICATION SECTION 16-135 | P1-090 | P1-135 | P1-180 | P1-270 | P1-315 | P1-000 |
| CASCODE AMPLIFICATION SECTION 16-180 | P1-135 | P1-180 | P1-225 | P1-315 | P1-000 | P1-045 |
| CASCODE AMPLIFICATION SECTION 16-225 | P1-180 | P1-225 | P1-270 | P1-000 | P1-045 | P1-090 |
| CASCODE AMPLIFICATION SECTION 16-270 | P1-225 | P1-270 | P1-315 | P1-045 | P1-090 | P1-135 |
| CASCODE AMPLIFICATION SECTION 16-315 | P1-270 | P1-315 | P1-000 | P1-090 | P1-135 | P1-180 |

FIG. 10

| | TERMINAL A | TERMINAL B | TERMINAL C | TERMINAL D | TERMINAL E | TERMINAL F | TERMINAL G | TERMINAL H | TERMINAL I | TERMINAL J | TERMINAL K | TERMINAL L | TERMINAL M | TERMINAL N |
|---|---|---|---|---|---|---|---|---|---|---|---|---|---|---|
| CASCODE AMPLIFICATION SECTION 19-000 | P1-292.5 | P1-315 | P1-337.5 | P1-000 | P1-022.5 | P1-045 | P1-067.5 | P1-112.5 | P1-135 | P1-157.5 | P1-180 | P1-202.5 | P1-225 | P1-247.5 |
| CASCODE AMPLIFICATION SECTION 19-045 | P1-337.5 | P1-000 | P1-022.5 | P1-045 | P1-067.5 | P1-090 | P1-112.5 | P1-157.5 | P1-180 | P1-202.5 | P1-225 | P1-247.5 | P1-270 | P1-292.5 |
| CASCODE AMPLIFICATION SECTION 19-090 | P1-022.5 | P1-045 | P1-067.5 | P1-090 | P1-112.5 | P1-135 | P1-157.5 | P1-202.5 | P1-225 | P1-247.5 | P1-270 | P1-292.5 | P1-315 | P1-337.5 |
| CASCODE AMPLIFICATION SECTION 19-135 | P1-067.5 | P1-090 | P1-112.5 | P1-135 | P1-157.5 | P1-180 | P1-202.5 | P1-247.5 | P1-270 | P1-292.5 | P1-315 | P1-337.5 | P1-000 | P1-022.5 |
| CASCODE AMPLIFICATION SECTION 19-180 | P1-112.5 | P1-135 | P1-157.5 | P1-180 | P1-202.5 | P1-225 | P1-247.5 | P1-292.5 | P1-315 | P1-337.5 | P1-000 | P1-022.5 | P1-045 | P1-067.5 |
| CASCODE AMPLIFICATION SECTION 19-225 | P1-157.5 | P1-180 | P1-202.5 | P1-225 | P1-247.5 | P1-270 | P1-292.5 | P1-337.5 | P1-000 | P1-022.5 | P1-045 | P1-067.5 | P1-090 | P1-112.5 |
| CASCODE AMPLIFICATION SECTION 19-270 | P1-202.5 | P1-225 | P1-247.5 | P1-270 | P1-292.5 | P1-315 | P1-337.5 | P1-022.5 | P1-045 | P1-067.5 | P1-090 | P1-112.5 | P1-135 | P1-157.5 |
| CASCODE AMPLIFICATION SECTION 19-315 | P1-247.5 | P1-270 | P1-292.5 | P1-315 | P1-337.5 | P1-000 | P1-022.5 | P1-067.5 | P1-090 | P1-112.5 | P1-135 | P1-157.5 | P1-180 | P1-202.5 |

FIG. 15

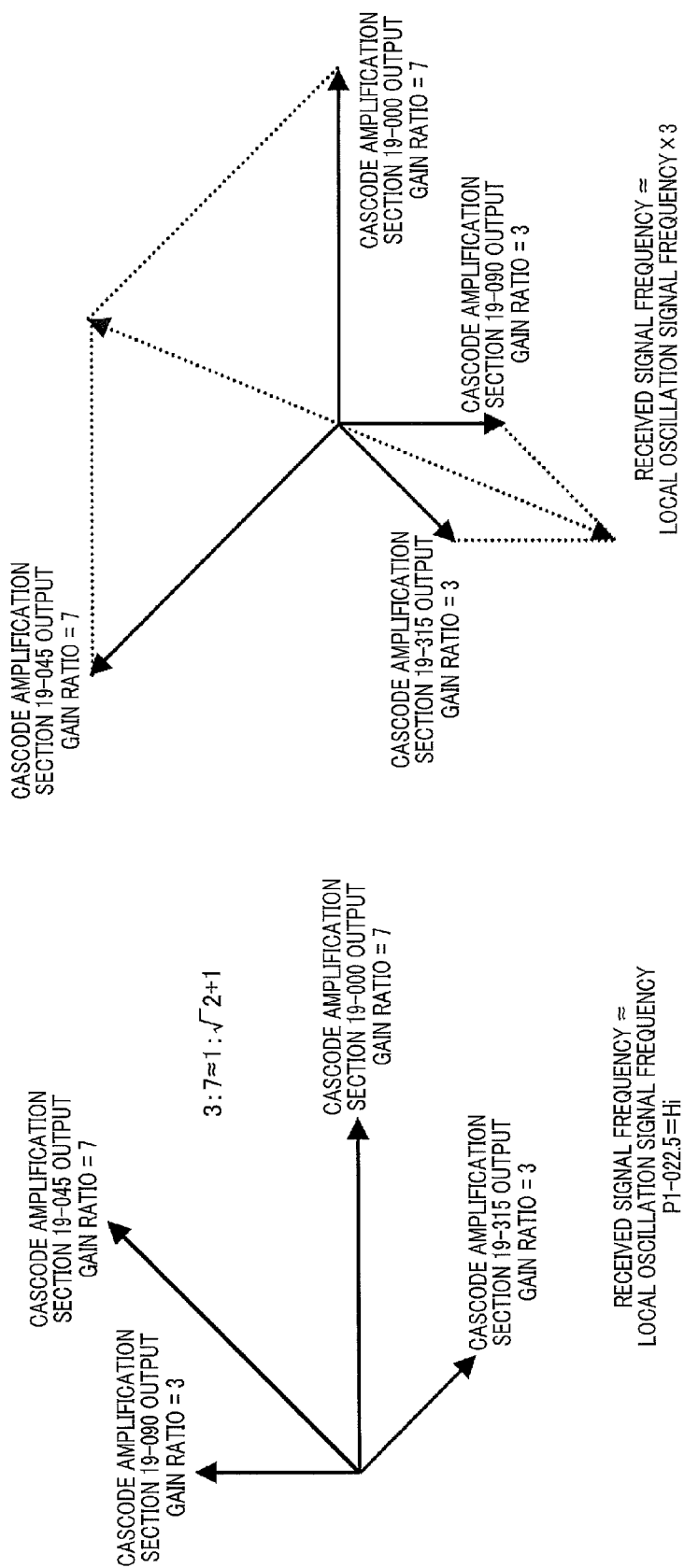

RECEIVER

TECHNICAL FIELD

The present invention relates to a receiver that receives a high-frequency signal and frequency-converts the signal to a baseband signal.

BACKGROUND ART

Conventionally, there has been known a receiver that receives a high-frequency signal and frequency-converts the received signal to a baseband signal. Such a receiver is disclosed, for example, in NPL 1. FIG. 1 is a block diagram of receiver 500 of NPL 1.

In FIG. 1, receiver 500 is provided with antennas 1-1 and 1-2, low noise amplifiers (hereinafter, referred to as "LNA") 2-1 and 2-2, phase adjusters 3-1 and 3-2, frequency converters 4-1 and 4-2, and local oscillation signal generating section 5.

Received signal received by antennas 1-1 and 1-2 are amplified by LNAs 2-1 and 2-2 and outputted to phase adjusters 3-1 and 3-2. Phase adjusters 3-1 and 3-2 perform phase adjustment so that the received signals amplified by LNAs 2-1 and 2-2 respectively become in-phase with each other. Phase adjusters 3-1 and 3-2 output the phase-adjusted received signals to frequency converters 4-1 and 4-2. Local oscillation signal generating section 5 outputs a local oscillation signal which is a high-frequency signal close to the received signal to frequency converters 4-1 and 4-2. Frequency converters 4-1 and 4-2 frequency-convert the phase-adjusted received signals using the local oscillation signal and output the converted signals as baseband signals.

Thus, receiver 500 maximizes an amplitude gain by combining the received signals controlled so as to be in-phase with each other. That is, receiver 500 constitutes a diversity receiver that performs so-called maximum ratio combining and improves reception sensitivity.

FIG. 2 is a configuration diagram of phase adjusters 3-1 and 3-2 shown in FIG. 1. A signal inputted from a Vin terminal is amplified by transistors M1 and 2. The signal amplified by transistor M1 passes through resistor R1. At this time, a phase change occurs, which is determined by resistor R1 and capacitor C1. Similarly, when the signal amplified by transistor M2 passes through capacitor C2, a phase change occurs, which is determined by capacitor C2 and resistor R2. The phase-changed signals are combined in a common load Z and outputted from a Vout terminal. At this time, phase adjusters 3-1 and 3-2 cause a difference between a phase change determined by resistor R1 and capacitor C1 and a phase change determined by capacitor C2 and resistor R2 to become 90 degrees and make the amounts of amplification of transistors M1 and M2 variable to thereby perform phase adjustment.

CITATION LIST

Non-Patent Literature

NPL 1
"A Low-Power Single-Weight-Combiner 802.11abg SoC in 0.13 µm CMOS for Embedded Applications Utilizing An Area and Power Efficient Cartesian Phase Shifter and Mixer Circuit," IEEE JOURNAL OF SOLID-STATE CIRCUITS, VOL. 43, NO. 5, May 2008

SUMMARY OF INVENTION

Technical Problem

However, the receiver according to NPL 1 has a problem in that the resistor and the capacitor for producing a phase change cause an increase in the circuit scale. Moreover, the receiver according to NPL 1 needs to provide a resistor and a capacitor for each receiving frequency, resulting in a problem in that the circuit scale further increases.

An object of the present invention is to provide a receiver capable of improving reception sensitivity while avoiding an increase in circuit scale.

Solution to Problem

A receiver according to an aspect of the present invention includes: a multi-phase local oscillation signal generating section that generates a plurality of local oscillation signals of different phases; a phase selection signal generating section that generates a phase selection signal used to select a baseband signal of a predetermined phase based on a detection result of a reception level of a high-frequency signal; and a frequency converter that frequency-converts the high-frequency signal based on the plurality of local oscillation signals, that generates a plurality of baseband signals of different phases, and that selects a baseband signal from among the plurality of baseband signals based on the phase selection signal.

Advantageous Effects of Invention

The present invention can improve reception sensitivity of a receiver while avoiding an increase in circuit scale.

BRIEF DESCRIPTION OF DRAWINGS

FIG. 10 is a table illustrating a connection between the cascode amplification section and a phase selection signal according to Embodiment 2 of the present invention;

FIG. 15 is a table illustrating a connection between the cascode amplifier and a phase selection signal according to Embodiment 3 of the present invention;

FIG. 16C is a vector diagram illustrating an example of a signal outputted to HRM according to Embodiment 3 of the present invention;

FIG. 16D is a vector diagram illustrating an example of a signal outputted to HRM according to Embodiment 3 of the present invention;

DESCRIPTION OF EMBODIMENTS

Figure 1:
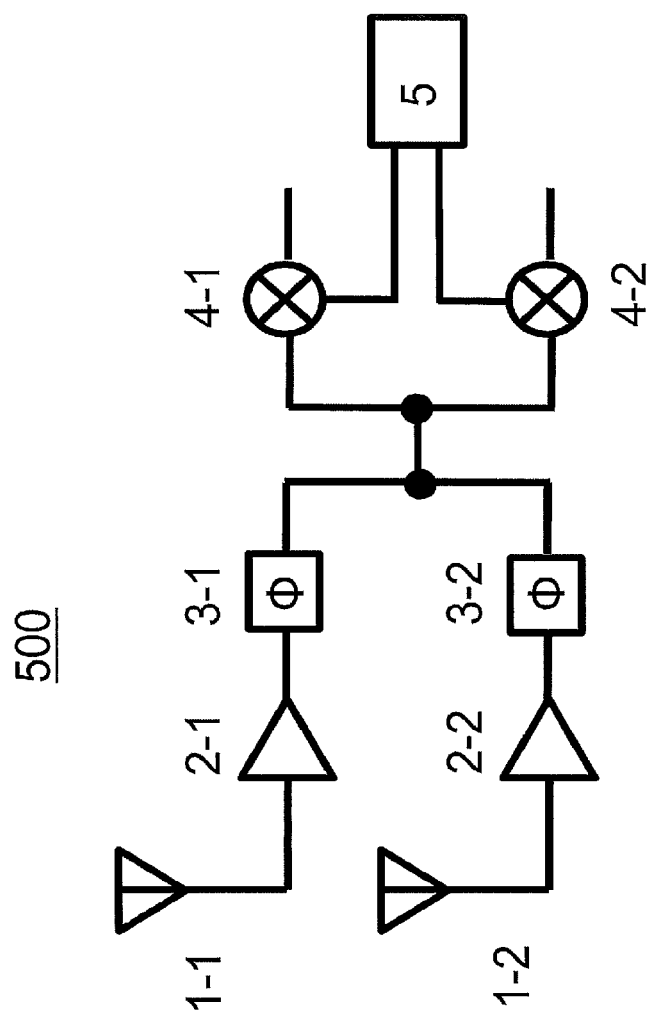
FIG. 1 is a block diagram of a receiver according to a related art.
Figure 2:
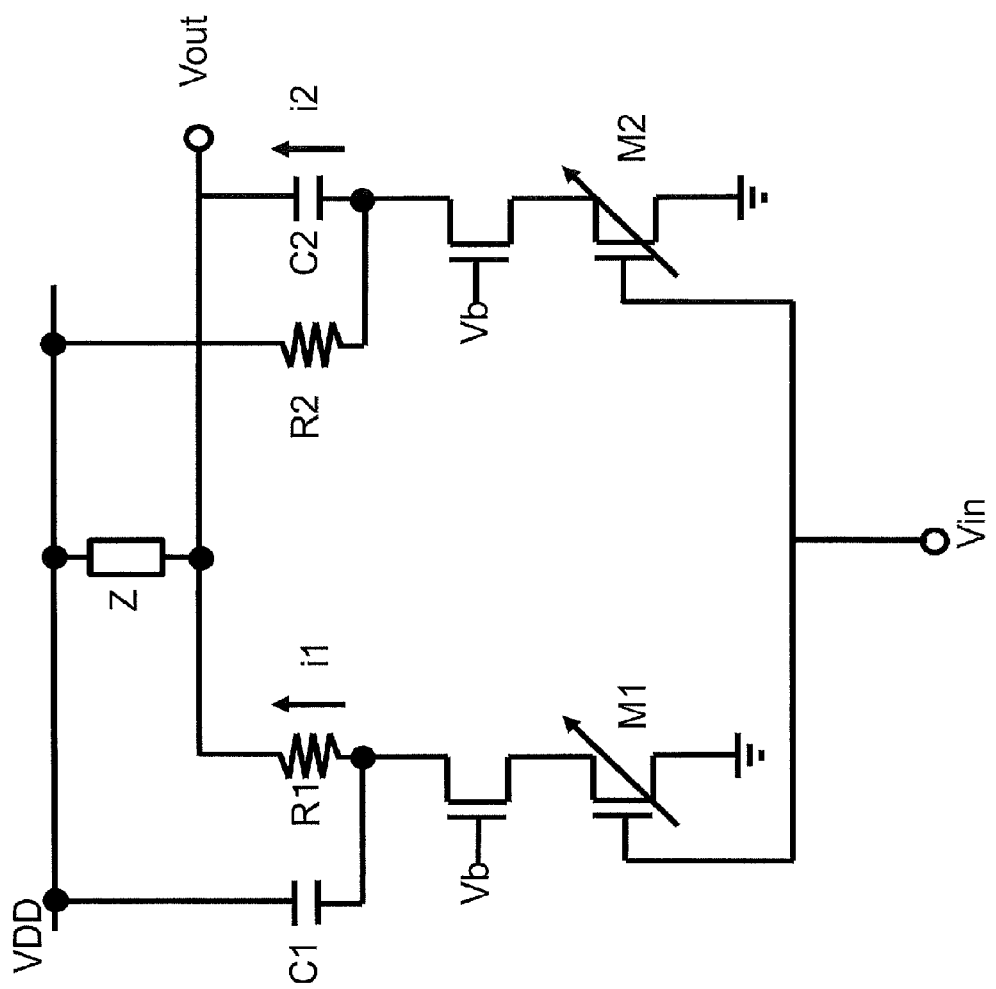
FIG. 2 is a configuration diagram of a phase adjuster of the receiver according to the related art.

Hereinafter, exemplary embodiments of the present invention will be described in detail with reference to the accompanying drawings. Throughout the drawings, the same components will be illustrated with the same reference numerals.

(Embodiment 1)

Embodiment 1 of the present invention will be described.

<Configuration of Receiver 100>

Figure 3:
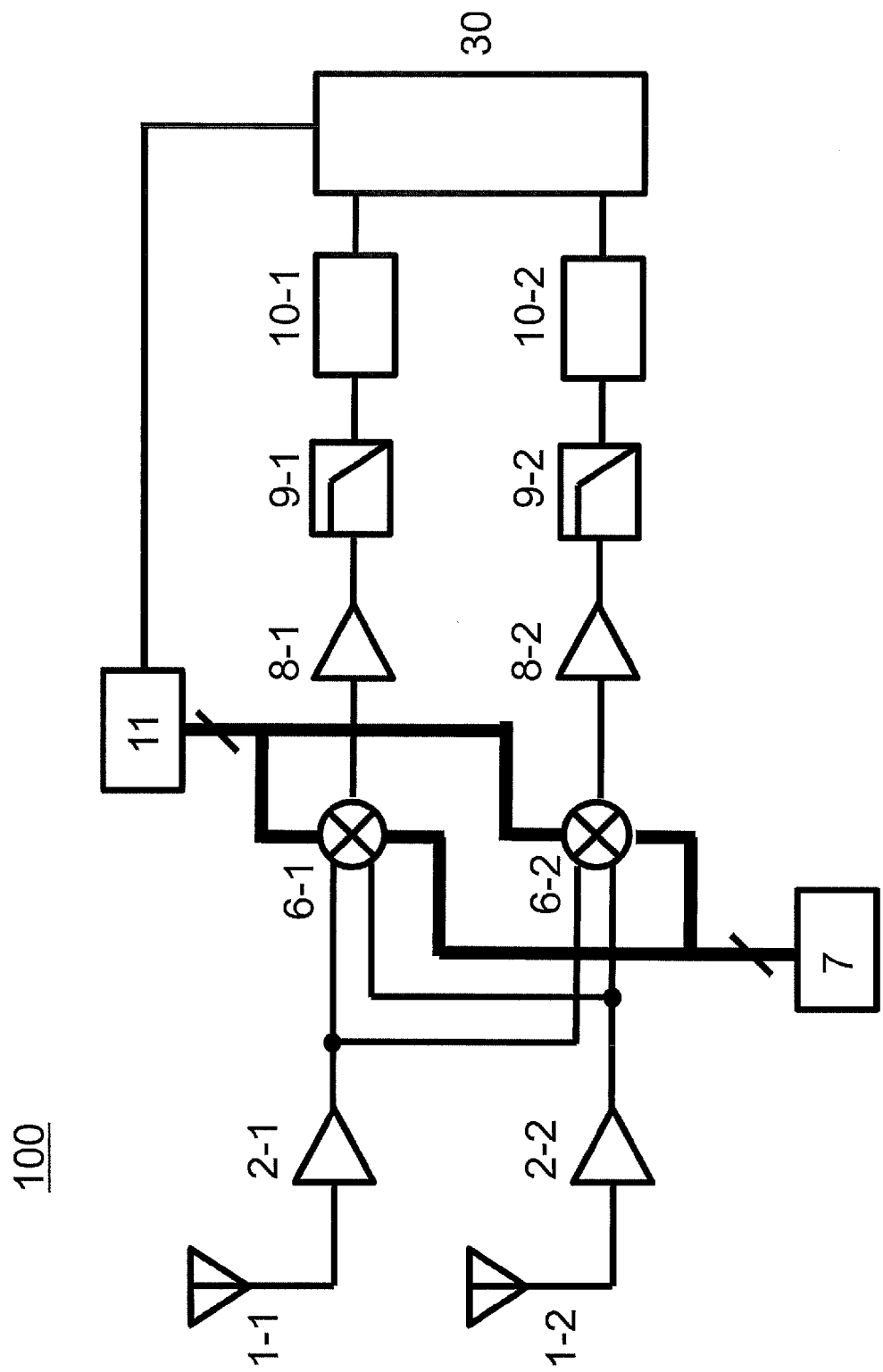
FIG. 3 is a block diagram of a receiver according to Embodiment 1 of the present invention.

A configuration example of receiver 100 according to Embodiment 1 of the present invention will be described. FIG. 3 is a block diagram of receiver 100.

In FIG. 3, receiver 100 includes antennas 1-1 and 1-2, LNAs 2-1 and 2-2, frequency converters 6-1 and 6-2, multi-phase local oscillation signal generating section 7, variable gain amplifiers (hereinafter, referred to as "VGA") 8-1 and 8-2, low pass filters (hereinafter, referred to as "LPF") 9-1 and 9-2, analog-digital converters (hereinafter, referred to as "ADC") 10-1 and 10-2, phase selection signal generating section 11 and digital signal processing section 30.

Received signal 1 received by antenna 1-1 is amplified by LNA 2-1 and inputted to frequency converters 6-1 and 6-2. Similarly, received signal 2 received by antenna 1-2 is amplified by LNA 2-2 and inputted to frequency converters 6-1 and 6-2. Received signals 1 and 2 are high-frequency signals.

Multi-phase local oscillation signal generating section 7 outputs a plurality of local oscillation signals of different phases to frequency converters 6-1 and 6-2. Phase selection signal generating section 11 outputs a phase selection signal to frequency converters 6-1 and 6-2.

Frequency converters 6-1 and 6-2 frequency-convert received signals 1 and 2 using a plurality of local oscillation signals and generate a plurality of baseband signals of different phases respectively. Frequency converters 6-1 and 6-2 select a baseband signal based on the phase selection signal and output the selected baseband signal to VGAs 8-1 and 8-2, respectively. At this time, there is a phase difference of 90 degrees between the output signal of frequency converter 6-1 and the output signal of frequency converter 6-2.

VGAs 8-1 and 8-2 amplify the baseband signals from frequency converters 6 and output the amplified signals to LPFs 9-1 and 9-2. LPFs 9-1 and 9-2 remove unnecessary high frequency components from the baseband signals from VGAs 8-1 and 8-2 and output the baseband signals to ADCs 10-1 and 10-2. ADCs 10-1 and 10-2 convert the baseband signals from LPFs 9-1 and 9-2 to digital signals.

The digital signals outputted from ADCs 10-1 and 10-2 are inputted to digital signal processing section 30. Digital signal processing section 30 performs predetermined signal processing on the digital signals and outputs the signals as speech or images from an output apparatus which is not shown. Digital signal processing section 30 outputs the signal processing result to phase selection signal generating section 11 as a feedback signal. For example, digital signal processing section 30 performs level detection processing on the received signal and outputs a feedback signal to phase selection signal generating section 11 so that the level detection result becomes a maximum.

<Configuration of Multi-Phase Local Oscillation Signal Generating Section 7>

Figure 4:
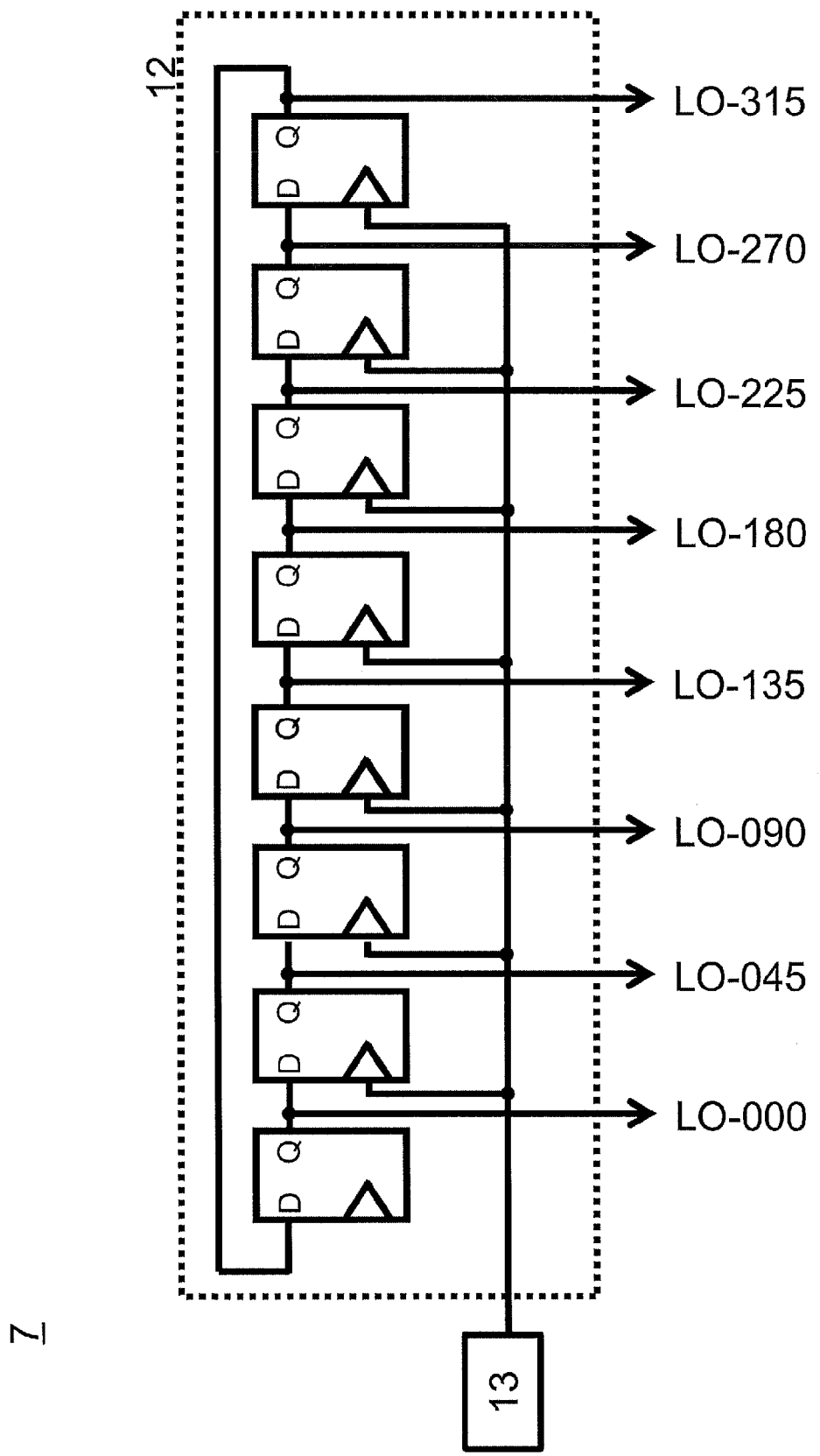
FIG. 4 is a block diagram of a multi-phase local oscillation signal generating section according to Embodiment 1 of the present invention.

A configuration example of multi-phase local oscillation signal generating section 7 will be described. FIG. 4 is a block diagram of multi-phase local oscillation signal generating section 7.

In FIG. 4, multi-phase local oscillation signal generating section 7 includes multi-phase local oscillation signal generating circuit 12 and reference local oscillation signal generating section 13. Multi-phase local oscillation signal generating circuit 12 is constructed of D flip flops which are general circuits. Multi-phase local oscillation signal generating circuit 12 converts a reference local oscillation signal outputted from reference local oscillation signal generating section 13 to multi-phase signals and outputs a plurality of local oscillation signals of different phases.

In FIG. 4, the plurality of local oscillation signals are, for example, LO-000 signal, LO-045 signal, LO-090 signal, LO-135 signal, LO-180 signal, LO-225 signal, LO-270 signal and LO-315 signal.

Figure 5:
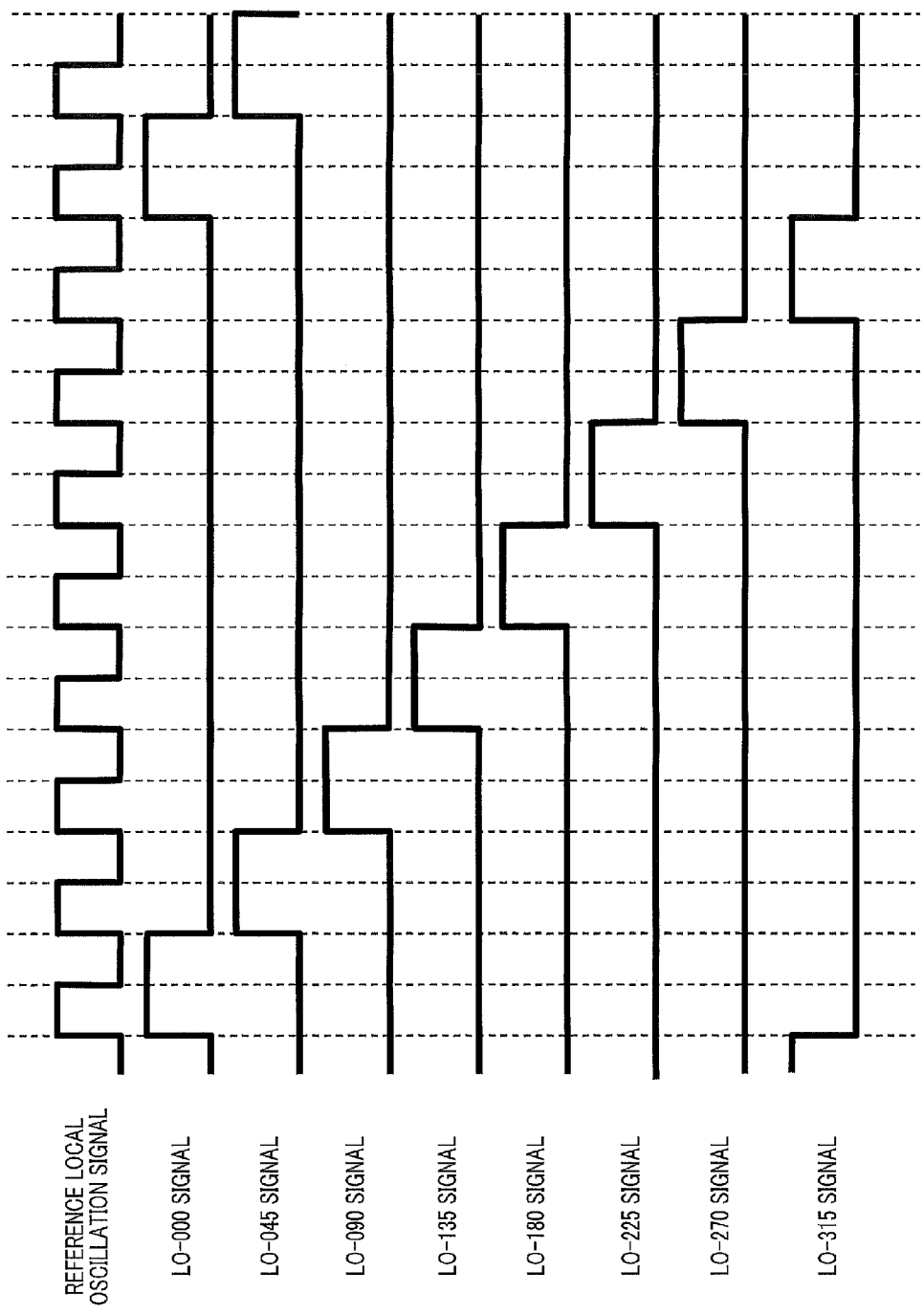
FIG. 5 is a timing chart of a plurality of local oscillation signals according to Embodiment 1 of the present invention.

FIG. 5 is a timing chart of a plurality of local oscillation signals. In FIG. 5, a Hi period of LO-000 to 315 signals is ⅛ of a cycle and phases are sequentially shifted by 45 degrees from the LO-000 signal.

<Configuration of Frequency Converter 6-1>

Figure 6:
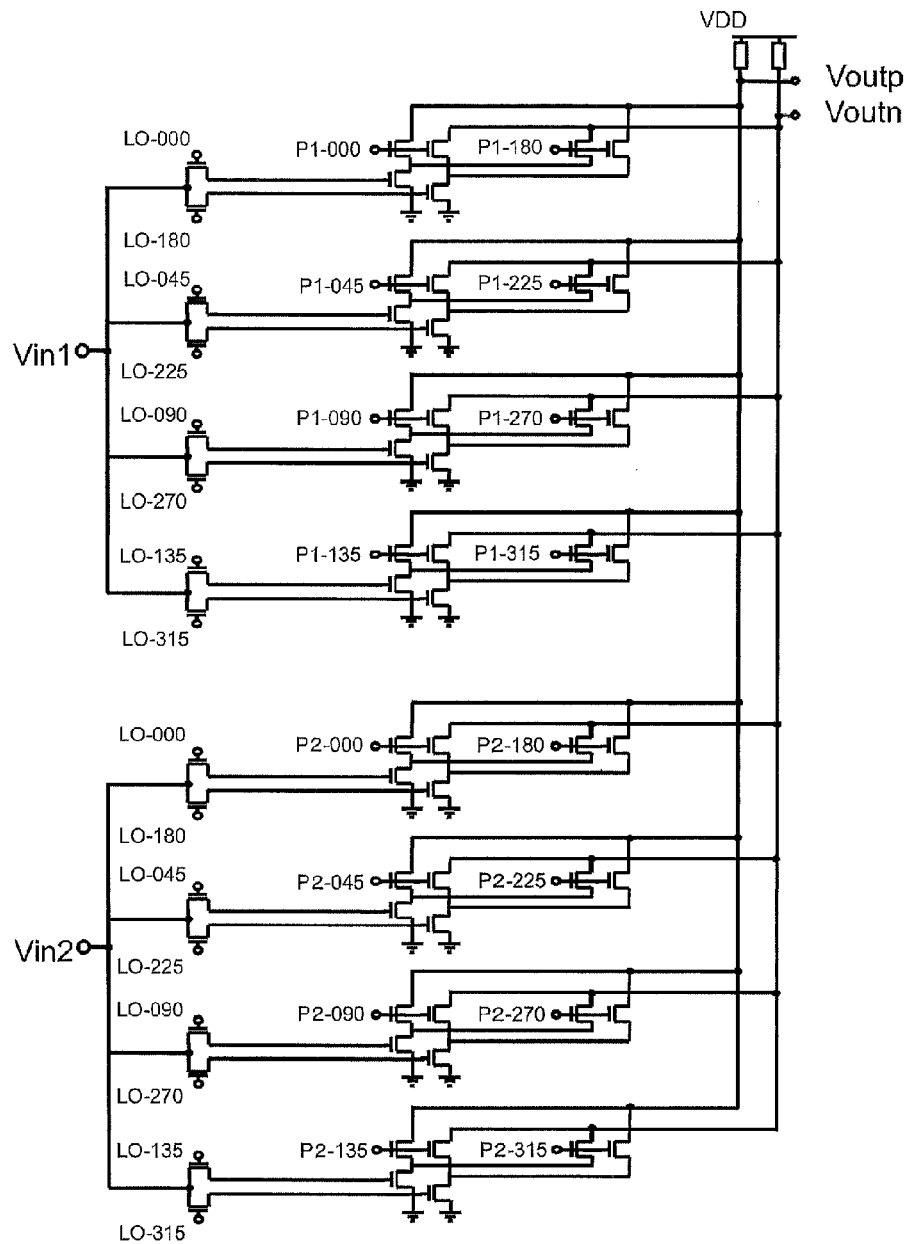
FIG. 6 is a configuration diagram of a frequency converter according to Embodiment 1 of the present invention.

A configuration example of frequency converter 6-1 will be described. FIG. 6 is a configuration diagram of frequency converter 6-1.

In FIG. 6, frequency converter 6-1 includes a Vin1 terminal, a Vin2 terminal, LO-000 to 315 terminals, P1-000 to 315 terminals, P2-000 to 315 terminals, a Voutp terminal, and a Voutn terminal.

The Vin1 terminal is connected to LNA 2-1 and receives received signal 1. The Vin2 terminal is connected to LNA 2-2 and receives received signal 2. The LO-000 to LO-315 terminals receive the LO-000 to LO-315 signals outputted from multi-phase local oscillation signal generating section 7. The Voutp terminal and Voutn terminal are connected to VGA 8-1. The P1-000 to P1-315 terminals and P2-000 to P2-315 terminals are connected to phase selection signal generating section 11.

Here, the phase selection signals inputted to the P1-000 to 315 terminals and P2-000 to P2-315 terminals are called "P1-000 to 315 signals" and "P2-000 to P2-315 signals," respectively.

Received signal 1 inputted from the Vin1 terminal is frequency-converted by each passive mixer. Each passive mixer is made up of an NMOS whose gate is connected to each of the LO-000 to 315 terminals. Received signal 1 is amplified by each cascode amplifier connected to each passive mixer and outputted from the Voutp terminal and Voutn terminal.

In each cascode amplifier, each of the P1-000 to P1-315 terminals is connected to the gate of the cascode transistor and the output is connected to the Voutp terminal or Voutn terminal. At this time, since the LO-000 to LO-315 signals inputted to the gates of the respective passive mixers have phases different from each other by 45 degrees, signals inputted from the respective passive mixers to the respective cascode amplifiers also have phases different from each other by 45 degrees.

Thus, when the cascode transistors are turned ON/OFF based on the phase selection signals inputted to the P1-000 to P1-315 terminals, the cascode amplifiers are turned ON/OFF accordingly. This makes it possible to selectively adjust the phase of a signal outputted to the Vout terminal.

A case will be described as a specific example where the P1-000 signal is Hi and the P1-045 to P1-315 signals are Low. In this case, the cascode transistor connected to the P1-000 terminal is turned ON, while the cascode transistors connected to the P1-045 to P1-315 terminals are turned OFF. Thus, signals frequency-converted by the LO-000 signal and the LO-180 signal are outputted to the Voutp terminal and the Voutn terminal.

At this time, if the signals outputted to the Voutp terminal and Voutn terminal are used as references, when only the P1-045 signal is Hi, a signal whose phase is delayed by 45 degrees is outputted. The same applies to the P1-090 to P1-315 signals. Therefore, in FIG. 6, it is possible to selectively adjust the phase by setting one of the P1-000 to P1-315 signals to Hi.

Received signal 2 inputted from the Vin2 terminal is also frequency-converted in the same way as described above and signals selectively phase-adjusted by the P2-000 to P2-315 signals are outputted to the Voutp terminal and Voutn terminal.

The cascode amplifier that amplifies frequency-converted received signal 1 and the cascode amplifier that amplifies frequency-converted received signal 2 have a common load. For this reason, a signal resulting from combining frequency-converted received signal 1 and frequency-converted received signal 2 is outputted to the Voutp terminal and the Voutn terminal. Moreover, since these signals are phase-adjusted so as to have the same phase, maximum ratio combining is possible. More specifically, digital signal processing section 30 performs level detection processing on the received signal, outputs a feedback signal to phase selection signal generating section 11 so that the level detection result becomes a maximum, which provides maximum ratio combining. For example, the following two methods are available as the feedback method at this time. A first method may be one in which a level detection result corresponding to each phase selection signal is stored in digital signal processing section 30 at the time of starting receiver 100 and a feedback signal is outputted so as to use a phase selection signal corresponding to a maximum level detection result. The other method may be one in which a phase selection signal is changed at every certain period, digital signal processing section 30 compares level detection results before and after the change of phase selection signals. When the level detection result after the change is higher, digital signal processing section 30 continues the change of the phase selection signals in the change direction this time, and when the level detection result after the change is lower, continues the change of phase selection signals in a direction opposite to the direction this time to output a feedback signal so as to search for a setting corresponding to a maximum level detection result.

The configuration of frequency converter 6-1 has been described by way of example so far, and since the same applies to frequency converter 6-2, description thereof will be omitted here. However, frequency converter 6-2 is different from frequency converter 6-1 in the arrangement of the P1-000 to 315 terminals. That is, in the case of frequency converter 6-2, in FIG. 6, for example, the P1-000 terminal is replaced with the P1-090 terminal, the P1-045 terminal with the P1-135 terminal, the P1-090 terminal with the P1-180 terminal, and so on, which is a configuration with terminals phase-shifted from one another by 90 degrees.

<Operation and Effect of Receiver 100>

As described above, receiver 100 frequency-converts a received signal using a plurality of local oscillation signals of different phases, selects and combines baseband signals of predetermined phases based on a phase selection signal from among a plurality of baseband signals thereby generated. This prevents receiver 100 from using resistors and capacitors for a phase change, and can thereby avoid an increase in the circuit scale. Furthermore, receiver 100 can maximize the amplitude gain of a received signal and improve reception sensitivity characteristics.

The present embodiment assumes the number of local oscillation signals outputted from the multi-phase local oscillation signal generating section to be eight, but the number of local oscillation signals is not limited to this.

The present embodiment selectively adjusts phases by setting one of the P1-000 to P1-315 signals to Hi, but may also selectively adjust phases by simultaneously setting two or more signals to Hi. More specifically, it is possible to reduce the number of phase adjusting steps by half by simultaneously setting signals of adjacent phases to Hi and perform phase adjustment more accurately.

(Embodiment 2)

Embodiment 2 of the present invention will be described. Receiver 100 according to Embodiment 1 frequency-converts harmonic interference that exists at an odd number multiple of the frequency of a local oscillation signal used for frequency conversion to a frequency within the same band as that of the received signal, which may cause reception characteristics to deteriorate. Thus, receiver 200 according to the present embodiment uses a harmonic rejection mixer (hereinafter, referred to as "HRM") that suppresses frequency conversion of harmonic interference.

<Configuration of Receiver 200>

Figure 7:
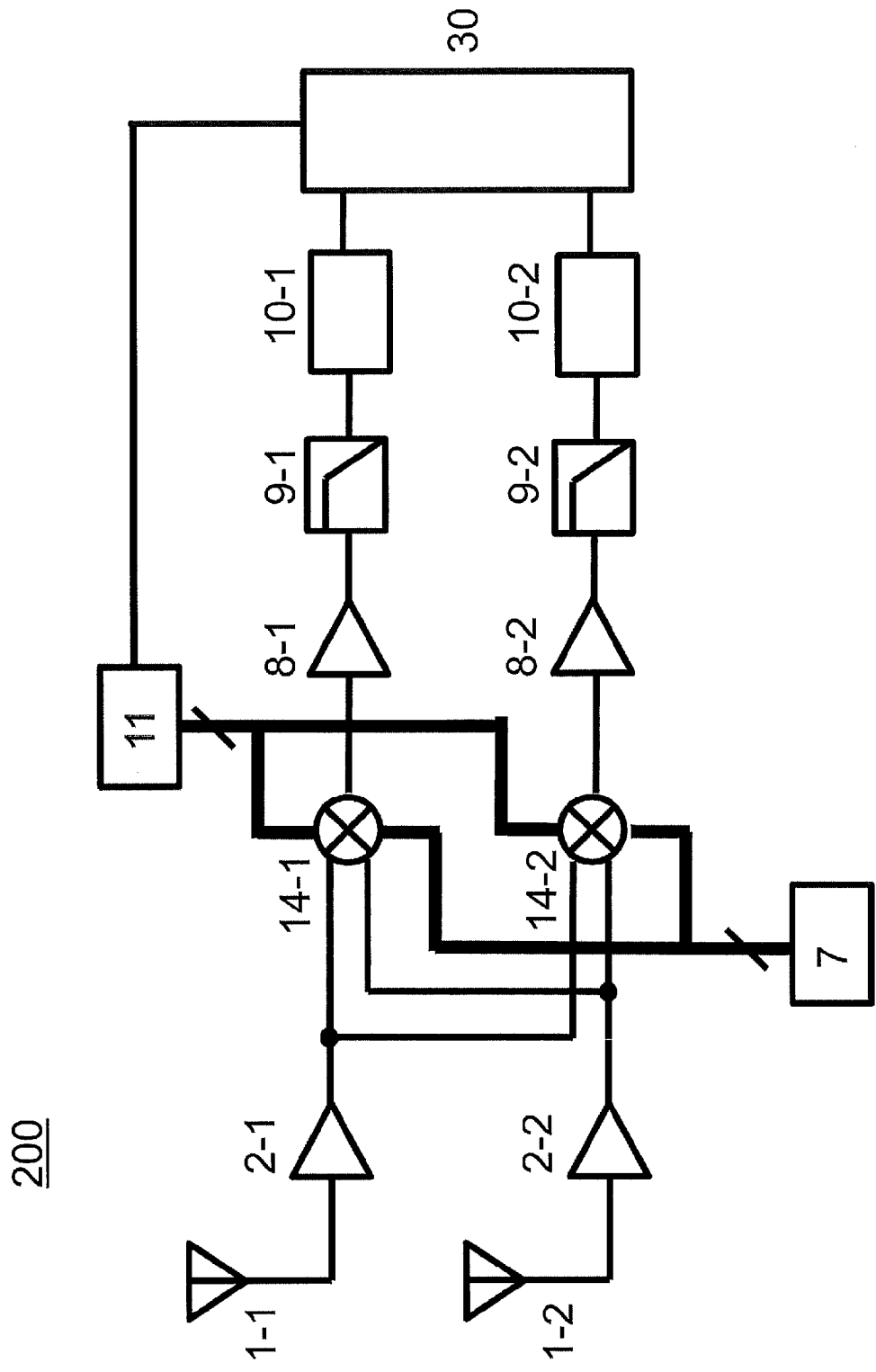
FIG. 7 is a block diagram of a receiver according to Embodiment 2 of the present invention.

A configuration example of receiver 200 will be described. FIG. 7 is a block diagram of receiver 200.

In FIG. 7, receiver 200 includes HRMs 14-1 and 14-2 instead of frequency converters 6-1 and 6-2.

<Configuration of HRM 14-1>

Figure 8:
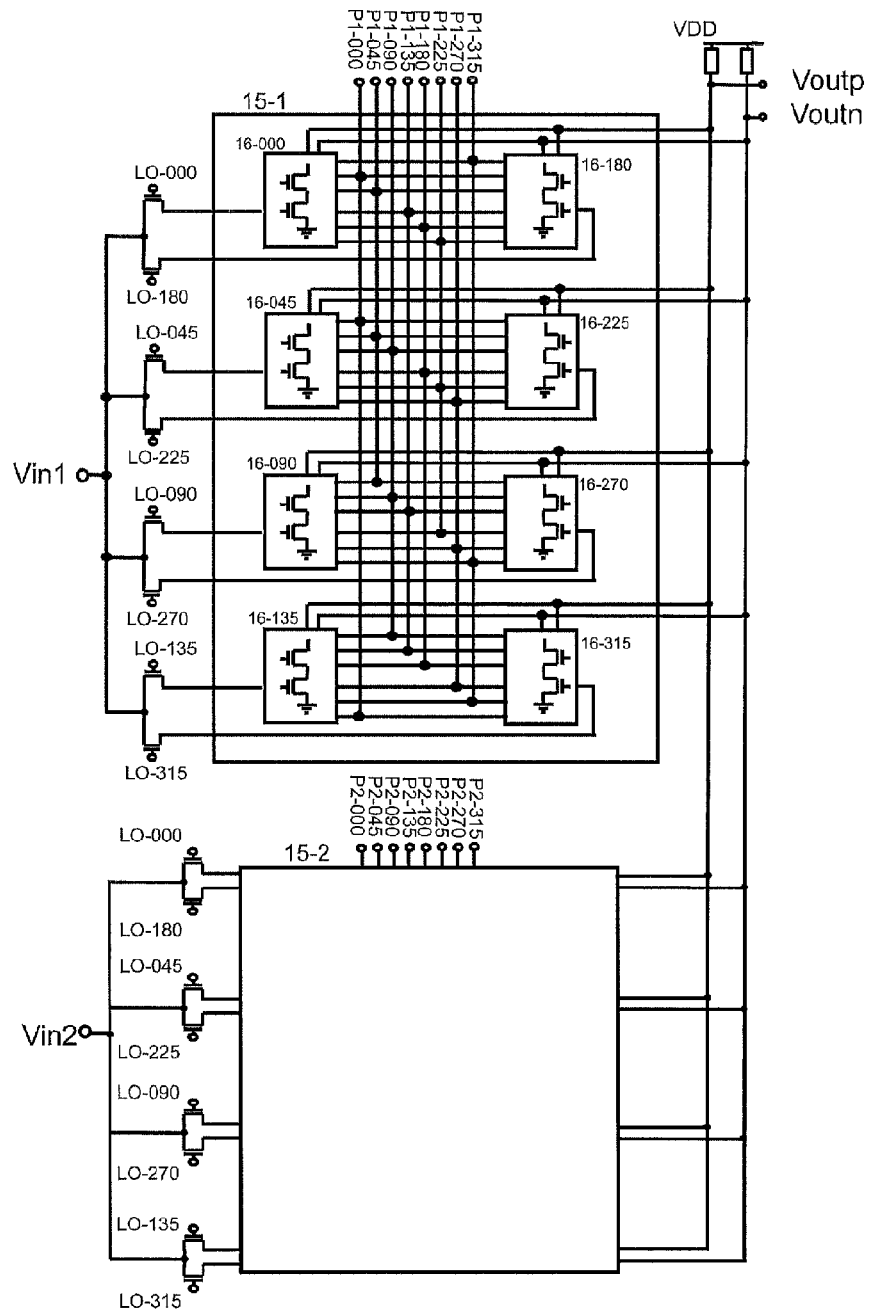
FIG. 8 is a block diagram of HRM according to Embodiment 2 of the present invention.

A configuration example of HRM 14-1 will be described. FIG. 8 is a block diagram of HRM 14-1.

In FIG. 8, HRM 14-1 is provided with output signal selection sections 15-1 and 15-2 instead of the cascode amplifiers of frequency converter 6-1. Output signal selection sections 15-1 and 15-2 have the same configuration. Hereinafter, output signal selection section 15-1 will be described by way of example.

Output signal selection section 15-1 is provided with a plurality of cascode amplification sections 16. In FIG. 8, there are eight cascode amplification sections 16, such as cascode amplification sections 16-000 to 16-315. Here, cascode amplification section 16-000 will be described as an example. Cascode amplification section 16-000 receives a signal from a passive mixer, to a gate of which an LO-000 signal is inputted. Cascode amplification section 16-000 selects a signal based on a phase selection signal such as P1-315 signal, P1-000 signal, P1-045 signal, P1-135 signal, P1-180 signal and P1-225 signal. Cascode amplification section 16-000 outputs the selected signal to the Voutp terminal or Voutn terminal. Similarly, cascode amplification sections 16-045 to 16-315 also each select a signal based on a phase selection signal connected as shown in the drawing and output the selected signal to the Voutp terminal or Voutn terminal.

The configuration of HRM 14-1 has been described as an example so far, and since the same applies to HRM 14-2, description thereof will be omitted here. However, HRM 14-2 is different from HRM 14-1 in the arrangement of the P1-000 to 315 terminals, which is a configuration with terminals phase-shifted from one another by 90 degrees.

<Configuration of Cascode Amplification Section 16>

Figure 9:
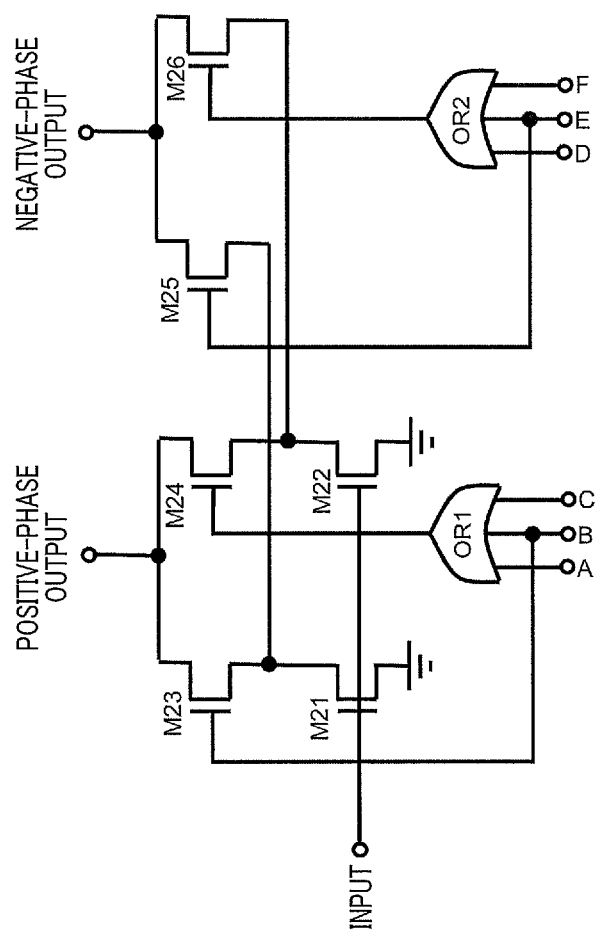
FIG. 9 is a configuration diagram of a cascode amplification section according to Embodiment 2 of the present invention.

A configuration example of cascode amplification section 16 will be described. FIG. 9 is a block diagram of cascode amplification section 16. Cascode amplification section 16 described here is any one of cascode amplification sections 16-000 to 16-315 shown in FIG. 8.

In FIG. 9, cascode amplification section 16 is provided with an input terminal connected to a passive mixer, a positive-phase output terminal connected to the Voutp terminal, a negative-phase output terminal connected to the Voutn terminal and terminals A to F to which a phase selection signal is inputted.

The input terminal is connected to the gates of amplification transistors M21 and M22. The drain of amplification transistor M21 is connected to the sources of cascode transistors M23 and M25. The drain of amplification transistor M22 is connected to the sources of cascode transistors M24 and M26. The drains of cascode transistors M23 and M24 are connected to the positive-phase output terminal. The drains of cascode transistors M25 and M26 are connected to the negative-phase output terminal.

The gate of cascode transistor M23 is connected to terminal B. The gate of cascode transistor M24 is connected to an output of OR circuit OR1 whose inputs are terminals A to C. The gate of cascode transistor M25 is connected to terminal E. The gate of cascode transistor M26 is connected to the output of OR circuit OR2 whose inputs are terminals D to F.

A gate-width ratio between amplification transistors M21 and M22 is approximately $(\sqrt{2}-1):1$. A gate-width ratio between cascode transistors M23 and M24 is also approximately $(\sqrt{2}-1):1$. A gate-width ratio between cascode transistors M25 and M26 is also approximately $(\sqrt{2}-1):1$. These gate-width ratios constitute a gain ratio of the cascode amplifiers.

FIG. 10 illustrates a relationship between cascode amplification sections 16-000 to 16-315 of output signal selection section 15-1 and phase selection signals connected to respective terminals A to F.

Figure 11B:
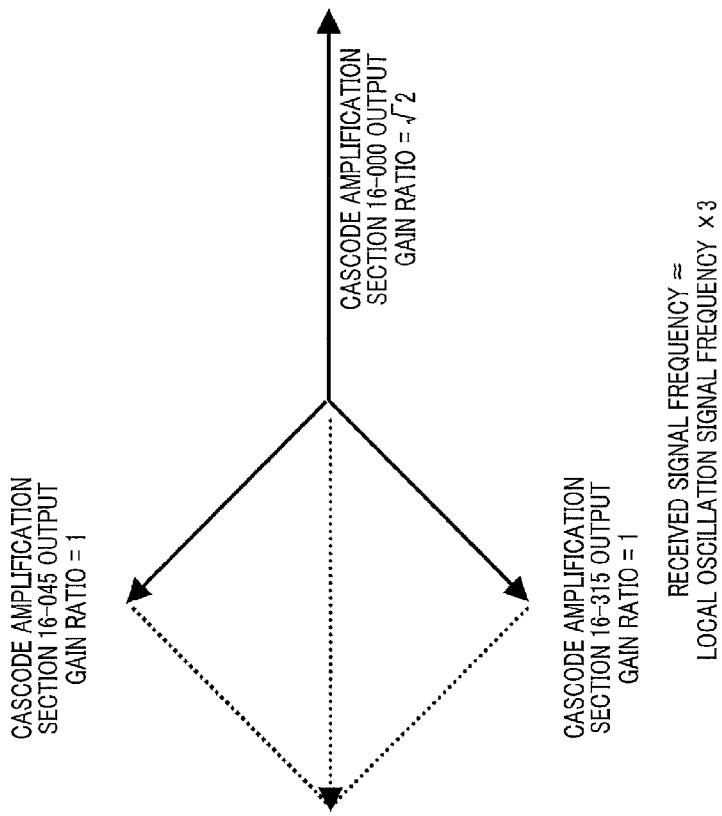
FIG. 11B is a vector diagram illustrating an example of a signal outputted to HRM according to Embodiment 2 of the present invention.
Figure 11A:
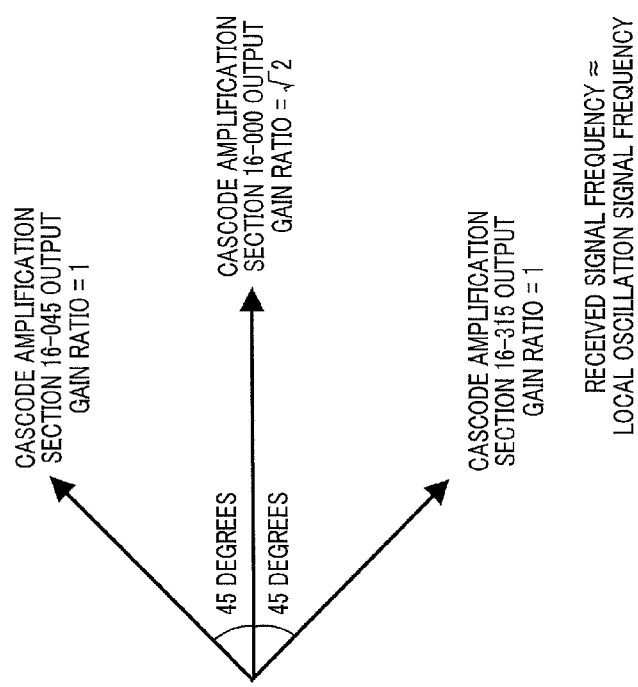
FIG. 11A is a vector diagram illustrating an example of a signal outputted to HRM according to Embodiment 2 of the present invention.

For example, when only the P1-000 signal is Hi, as shown in FIG. 10, the following terminals become Hi: terminal B of cascode amplification section 16-000, terminal A of cascode amplification section 16-045, terminal C of cascode amplification section 16-315, terminal F of cascode amplification section 16-135, terminal E of cascode amplification section 16-180 and terminal D of cascode amplification section 16-225. Therefore, a signal of gain ratio $\sqrt{2}$ from cascode amplification section 16-000, a signal of gain ratio 1 from cascode amplifier 16-045 and a signal of gain ratio 1 from cascode amplification section 16-315 are outputted to the Voutp terminal. FIGS. 11A and 11B show vector diagrams of the signals outputted to the Voutp terminal at this time.

FIG. 11A is a vector diagram when the frequency of a received signal is substantially the same as the frequency of a local oscillation signal inputted to the gate of a passive mixer. In FIG. 11A, each output has a phase difference of 45 degrees and has a gain ratio of $1:\sqrt{2}:1$.

FIG. 11B is a vector diagram when the frequency of a received signal is three times the frequency of a local oscillation signal inputted to the gate of a passive mixer. The received signal in FIG. 11B is harmonic interference that may cause deterioration of reception characteristics, but since the received signal is frequency-converted with third-order harmonics of the local oscillation signal, the phase difference thereof becomes three times that in FIG. 11A. At this time, when the respective output signal vectors are combined, the vectors cancel out with each other, and it is therefore possible to prevent harmonic interference from being frequency-converted to a frequency in the same band as that of the received signal.

Even when one of the P1-045 to P1-315 signals becomes Hi, the output signal has a similar phase or similar gain relationship and the combined signal can be adjusted by 45 degrees with reference to the case when the P1-000 signal is Hi. Output signal selection section 15-2 also performs similar operation using P2-000 to P2-315. Thus, maximum ratio combining is possible by performing phase adjustment so that signals outputted from output signal selection sections 15-1 and 15-2 are in-phase with each other.

<Operational Effects of Receiver 200>

As described above, receiver 200 can obtain operational effects similar to those of receiver 100. Using HRMs 14-1 and 14-2 that suppress frequency conversion of harmonic interference, receiver 200 can prevent, as in the case of receiver 100, harmonic interference existing at an odd number multiple of the frequency of the local oscillation signal used for frequency conversion from being frequency-converted to a frequency within the same band as that of the received signal, so that there is no deterioration of reception characteristics.

In the present embodiment, an assumption is made that the number of local oscillation signals outputted from the multiphase local oscillation signal generating section to be eight but the number of local oscillation signals is not limited to this.

(Embodiment 3)

Embodiment 3 of the present invention will be described. Receiver 300 according to the present embodiment uses HRMs that perform more accurate phase adjustment compared to receiver 200.

<Configuration of Receiver 300>

Figure 12:
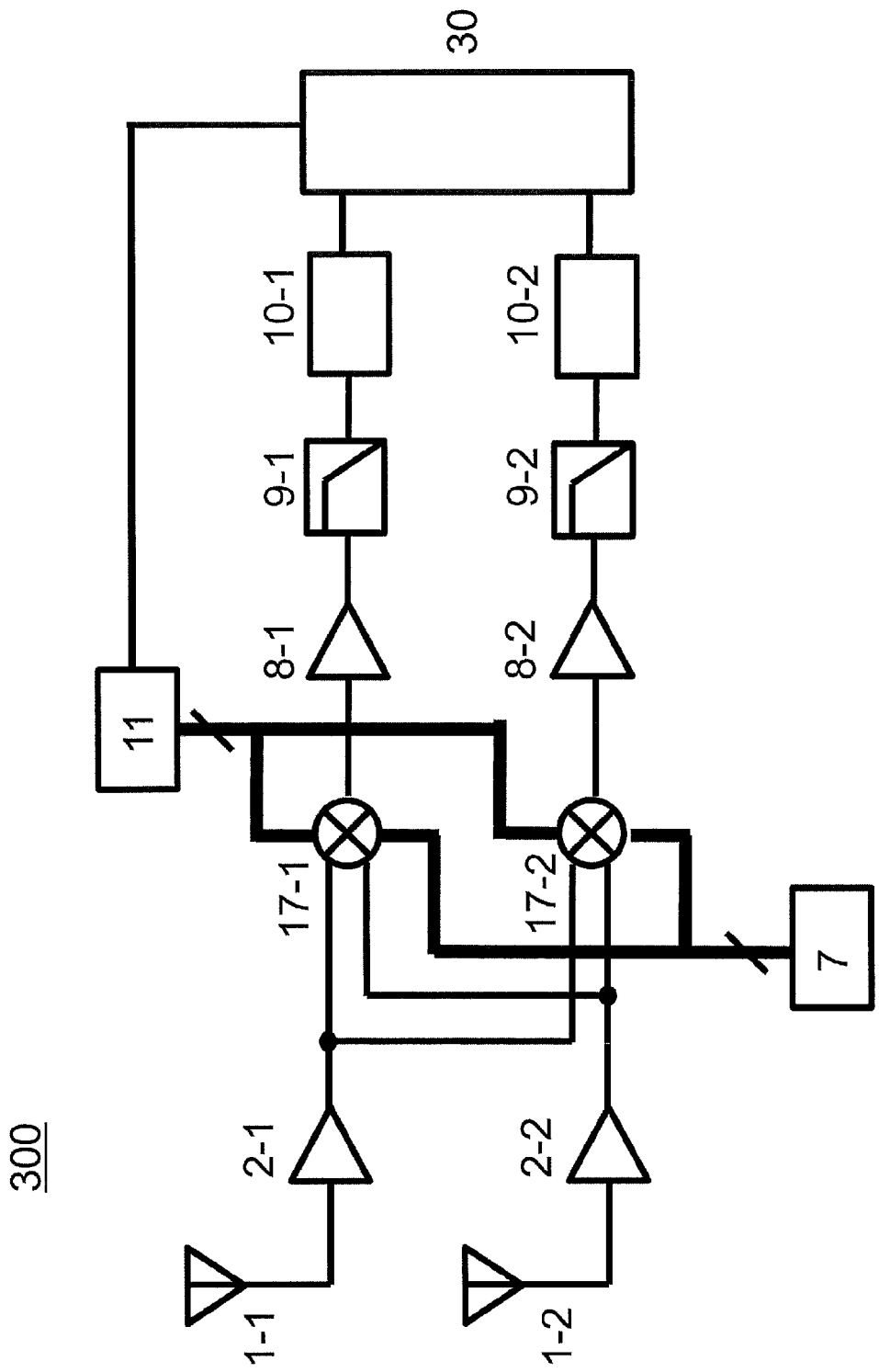
FIG. 12 is a block diagram of a receiver according to Embodiment 3 of the present invention.

A configuration example of receiver 300 will be described. FIG. 12 is a block diagram of receiver 300.

In FIG. 12, receiver 300 includes HRMs 17-1 and 17-2 instead of HRMs 14-1 and 14-2.

<Configuration of HRM 17-1>

Figure 13:
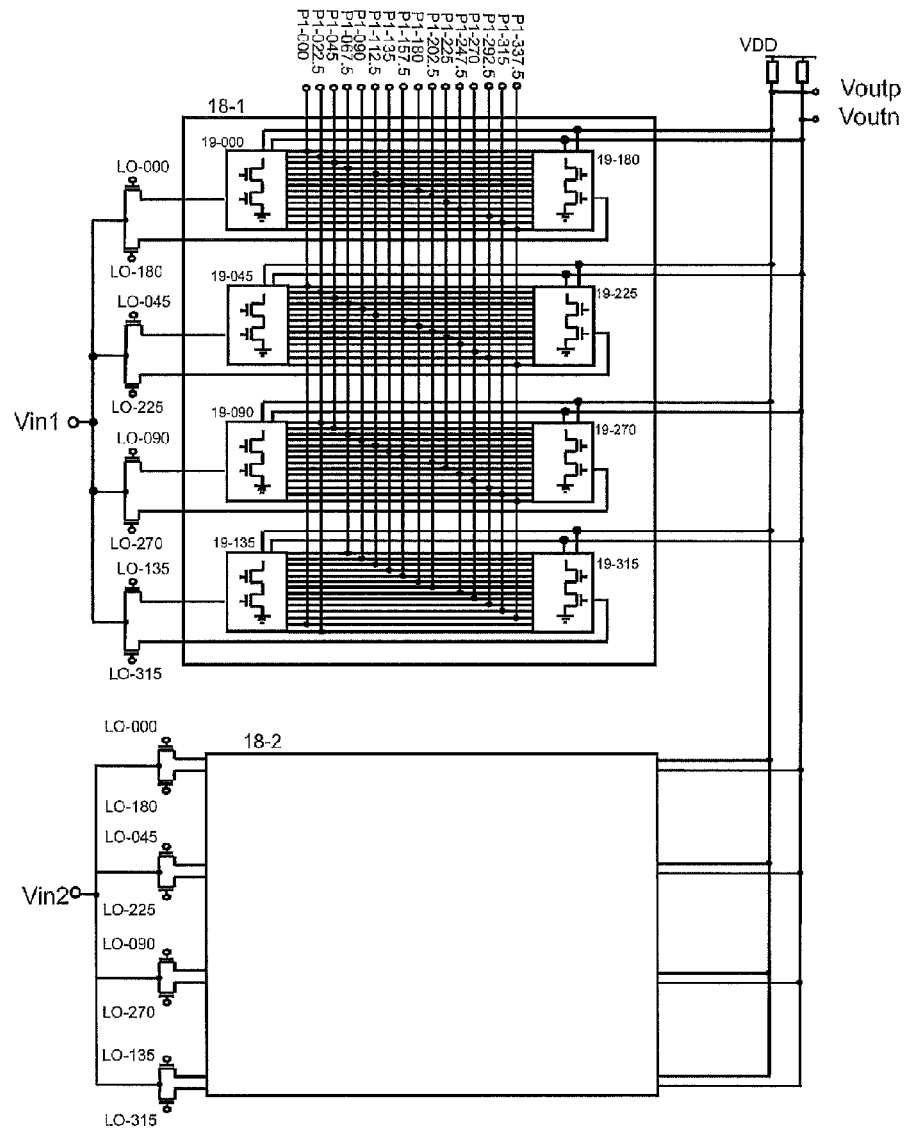
FIG. 13 is a block diagram of HRM according to Embodiment 3 of the present invention.

A configuration example of HRM 17-1 will be described. FIG. 13 is a block diagram of HRM 17-1.

In FIG. 13, HRM 17-1 includes output selection sections 18-1 and 18-2 instead of output selection sections 15-1 and 15-2. Output signal selection section 18-1 has the same configuration as that of output signal selection section 18-2. Hereinafter, output signal selection section 18-1 will be described as an example.

Output signal selection section 18-1 includes a plurality of cascode amplification sections 19. In FIG. 13, there are eight cascode amplification sections 19, such as cascode amplification sections 19-000 to 19-315. Here, cascode amplification section 19-000 will be described as an example. Cascode amplification section 19-000 receives a signal from a passive mixer, to a gate of which an LO-000 signal is inputted. Cascode amplification section 19-000 selects a signal based on a phase selection signal such as P1-000 signal, P1-022.5 signal, P1-045 signal, P1-067.5 signal, P1-090 signal, P1-112.5 signal, P1-135 signal, P1-157.5 signal, P1-180 signal, P1-202.5 signal, P1-225 signal, P1-247.5 signal, P1-270 signal, P1-292.5 signal, P1-315 signal and P1-337.5 signal. Cascode amplification section 19-000 outputs the selected signal to the Voutp terminal or Voutn terminal. Similarly, cascode amplification sections 19-045 to 19-315 also select a signal based on a phase selection signal connected as shown in the drawing and outputs the signal to the Voutp terminal or Voutn terminal.

The configuration of HRM 17-1 has been described as an example, and since the same applies to HRM 17-2, description thereof will be omitted here. However, HRM 17-2 is different from HRM 17-1 in the arrangement of the P1-000 to 315 terminals, which is a configuration with terminals phase-shifted from one another by 90 degrees.

<Configuration of Cascode Amplification Section 19>

Figure 14:
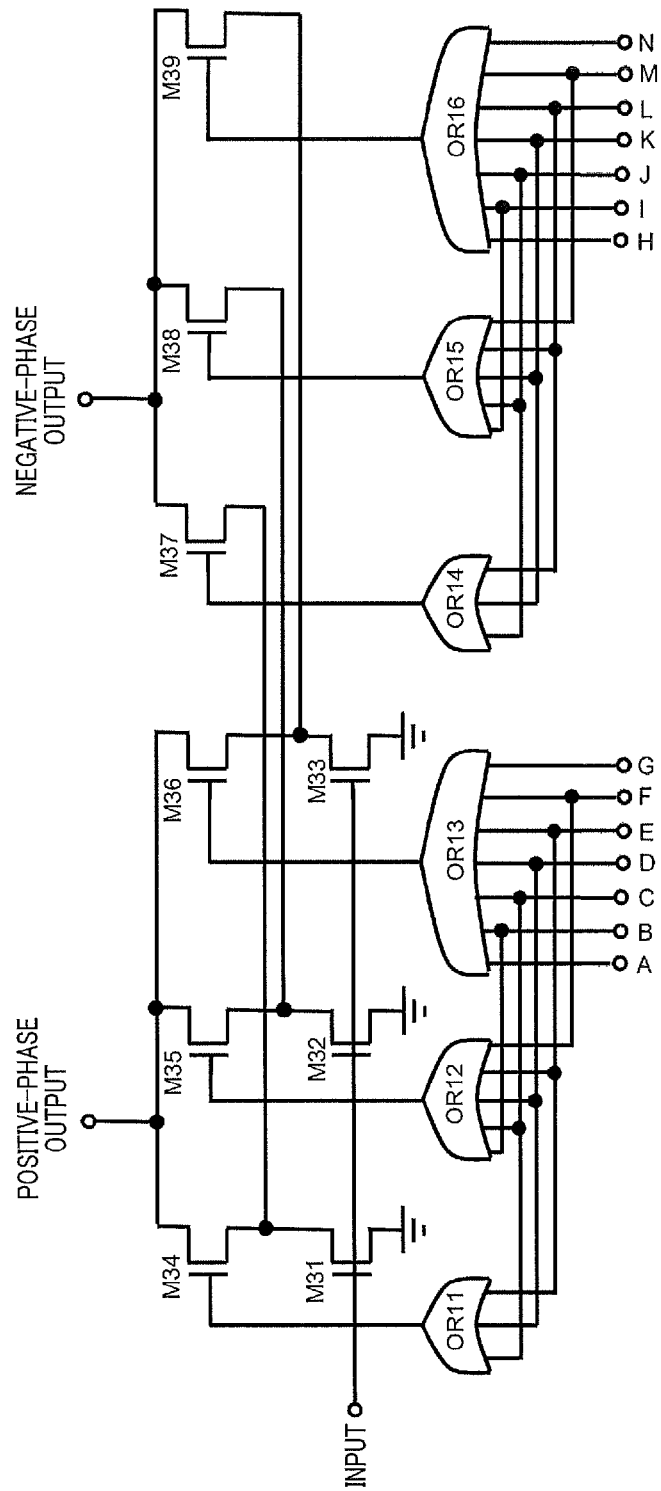
FIG. 14 is a configuration diagram of a cascode amplifier according to Embodiment 3 of the present invention.

A configuration example of cascode amplification section 19 will be described. FIG. 14 is a block diagram of cascode amplification section 19. Cascode amplification section 19 described here is any one of cascode amplification sections 19-000 to 19-315 shown in FIG. 13.

In FIG. 14, cascode amplification section 19 includes an input terminal connected to a passive mixer, a positive-phase output terminal connected to the Voutp terminal, a negative-phase output terminal connected to the Voutn terminal and terminals A to N to which a phase selection signal is inputted.

The input terminal is connected to the gates of amplification transistors M31, M32 and M33. The drain of amplification transistor M31 is connected to the sources of cascode transistors M34 and M37. The drain of amplification transistor M32 is connected to the sources of cascode transistors M35 and M38. The drain of amplification transistor M33 is connected to the sources of cascode transistors M36 and M39. The drains of cascode transistor M34, M35 and M36 are connected to the positive-phase output terminal. The drains of cascode transistors M37, M38 and M39 are connected to the negative-phase output terminal.

The gate of cascode transistor M34 is connected to the output of OR circuit OR11 whose inputs are terminals C to E. The gate of cascode transistor M35 is connected to the output of OR circuit OR12 whose inputs are terminals B to F. The gate of cascode transistor M36 is connected to the output of OR circuit OR13 whose inputs are terminals A to G. The gate of cascode amplifier M37 is connected to the output of OR circuit OR14 whose inputs are terminals J to L. The gate of cascode amplifier M38 is connected to the output of OR circuit OR15 whose inputs are terminals I to M. The gate of cascode amplifier M39 is connected to the output of OR circuit OR16 whose inputs are terminals H to N.

The gate-width ratio between amplification transistors M31, M32 and M33 is 2:2:3. The gate-width ratio between cascode transistors M34, M35 and M36 is also 2:2:3. The gate-width ratio between cascode transistors M37, M38 and M39 is also 2:2:3. These gate-width ratios constitute a gain ratio of the cascode amplifiers.

FIG. 15 illustrates a relationship between cascode amplification sections 19-000 to 19-315 of output signal selection section 18-1 and phase selection signals connected to respective terminals A to N.

Figure 16B:
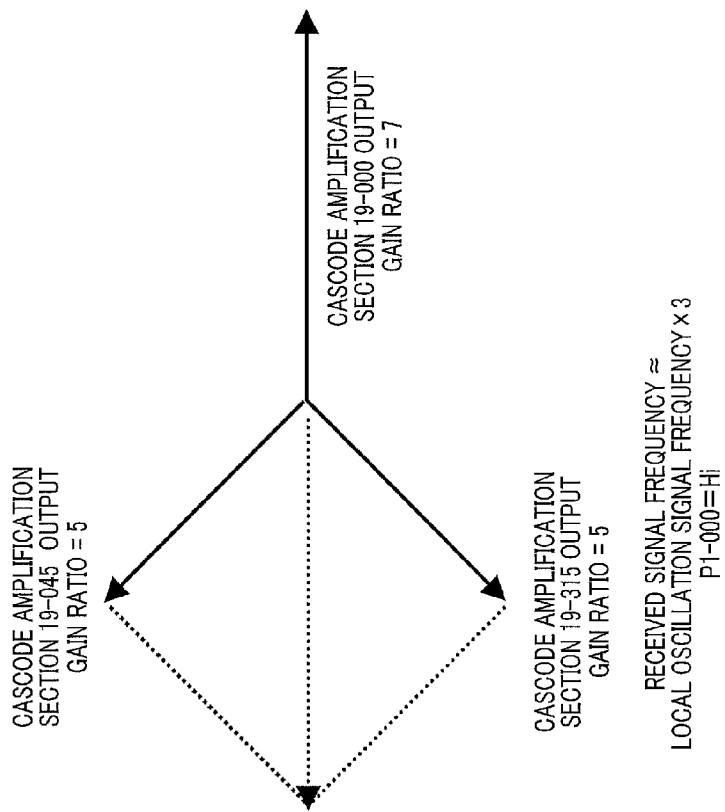
FIG. 16B is a vector diagram illustrating an example of a signal outputted to HRM according to Embodiment 3 of the present invention.
Figure 16A:
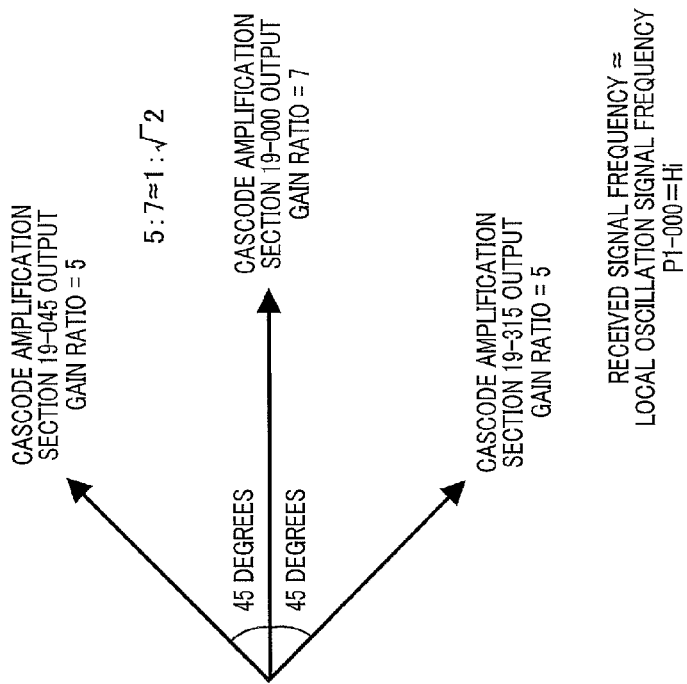
FIG. 16A is a vector diagram illustrating an example of a signal outputted to HRM according to Embodiment 3 of the present invention.

For example, when only the P1-000 signal is Hi, as shown in FIG. 15, the following terminals become Hi: terminal D of cascode amplification section 19-000, terminal B of cascode amplification section 19-045, terminal M of cascode amplification section 19-135, terminal K of cascode amplification section 19-180, terminal I of cascode amplification section 19-225, and terminal F of cascode amplification section 19-315. Therefore, a signal of gain ratio 7 from cascode amplification section 19-000, a signal of gain ratio 5 from cascode amplification section 19-045, and a signal of gain ratio 5 from cascode amplification section 19-315 are outputted to Voutp terminal. FIG. 16A and FIG. 16B show vector diagrams of the signals outputted to the Voutp terminal at this time. Similarly, FIG. 16C and FIG. 16D show vector diagrams of signals outputted to the Voutp terminal when only the P1-022.5 signal is Hi.

FIG. 16A and FIG. 16C are vector diagrams when the frequency of a received signal is substantially the same as the frequency of the local oscillation signal inputted to the gate of the passive mixer. FIG. 16B and FIG. 16D are vector diagrams when the frequency of a received signal is three times the frequency of the local oscillation signal inputted to the gate of the passive mixer. The received signal in FIG. 16B is harmonic interference that may cause deterioration of reception characteristics, but since the received signal is frequency-converted with third-order harmonics of the local oscillation signal, the phase difference thereof becomes three times that in FIG. 16A and FIG. 16C. At this time, when the respective output signal vectors are combined, the vectors cancel out with each other, and it is therefore possible to prevent harmonic interference from being frequency-converted to a frequency within the same band as that of the received signal.

Even when one of the P1-045 to P1-337.5 signals becomes Hi, the output signal has a similar phase or similar gain relationship and the combined signal can be adjusted by 22.5 degrees with reference to the case when the P1-000 signal is Hi. Output signal selection section 18-2 also performs similar operation using P2-000 to P2-337.5. Thus, maximum ratio combining is possible by performing phase adjustment so that signals outputted from output signal selection sections 18-1 and 18-2 are in-phase with each other.

<Operational Effects of Receiver 300>

As described above, receiver 300 can obtain operational effects similar to those of receiver 100 and receiver 200. Receiver 300 can perform phase adjustment with higher accuracy than receiver 200.

In the present embodiment, an assumption is made that the number of local oscillation signals outputted from the multi-phase local oscillation signal generating section to be eight, but the number of local oscillation signals is not limited to this.

(Embodiment 4)

Embodiment 4 of the present invention will be described. Receiver 400 according to the present embodiment uses HRMs using an operational amplifier instead of a cascode amplifier.

<Configuration of Receiver 400>

Figure 17:
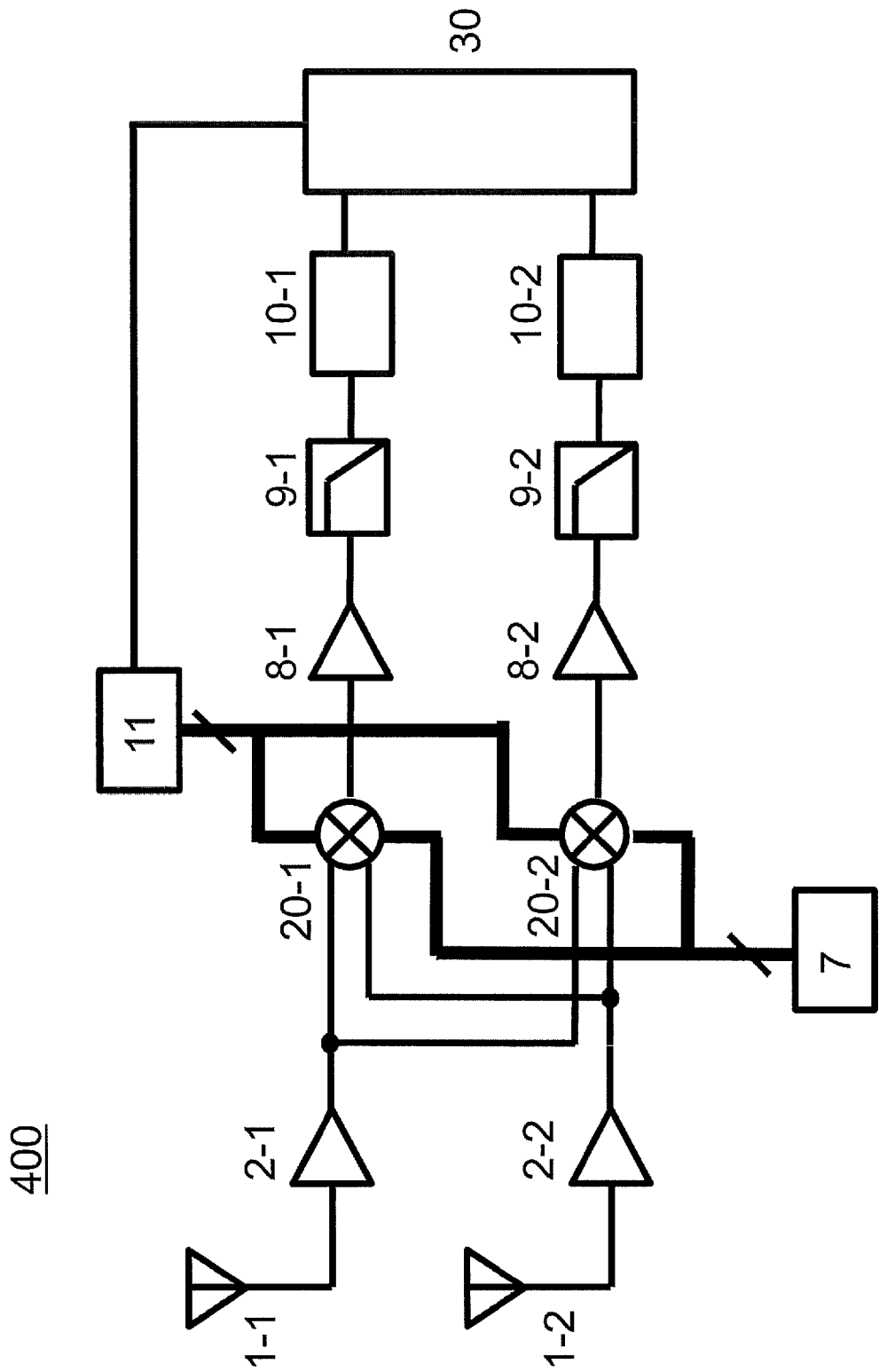
FIG. 17 is a block diagram of a receiver according to Embodiment 4 of the present invention.

A configuration example of receiver 400 will be described. FIG. 17 is a block diagram of receiver 400.

In FIG. 17, receiver 400 includes HRMs 20-1 and 20-2 instead of HRMs 17-1 and 17-2.

<Configuration of HRM 20-1>

Figure 18:
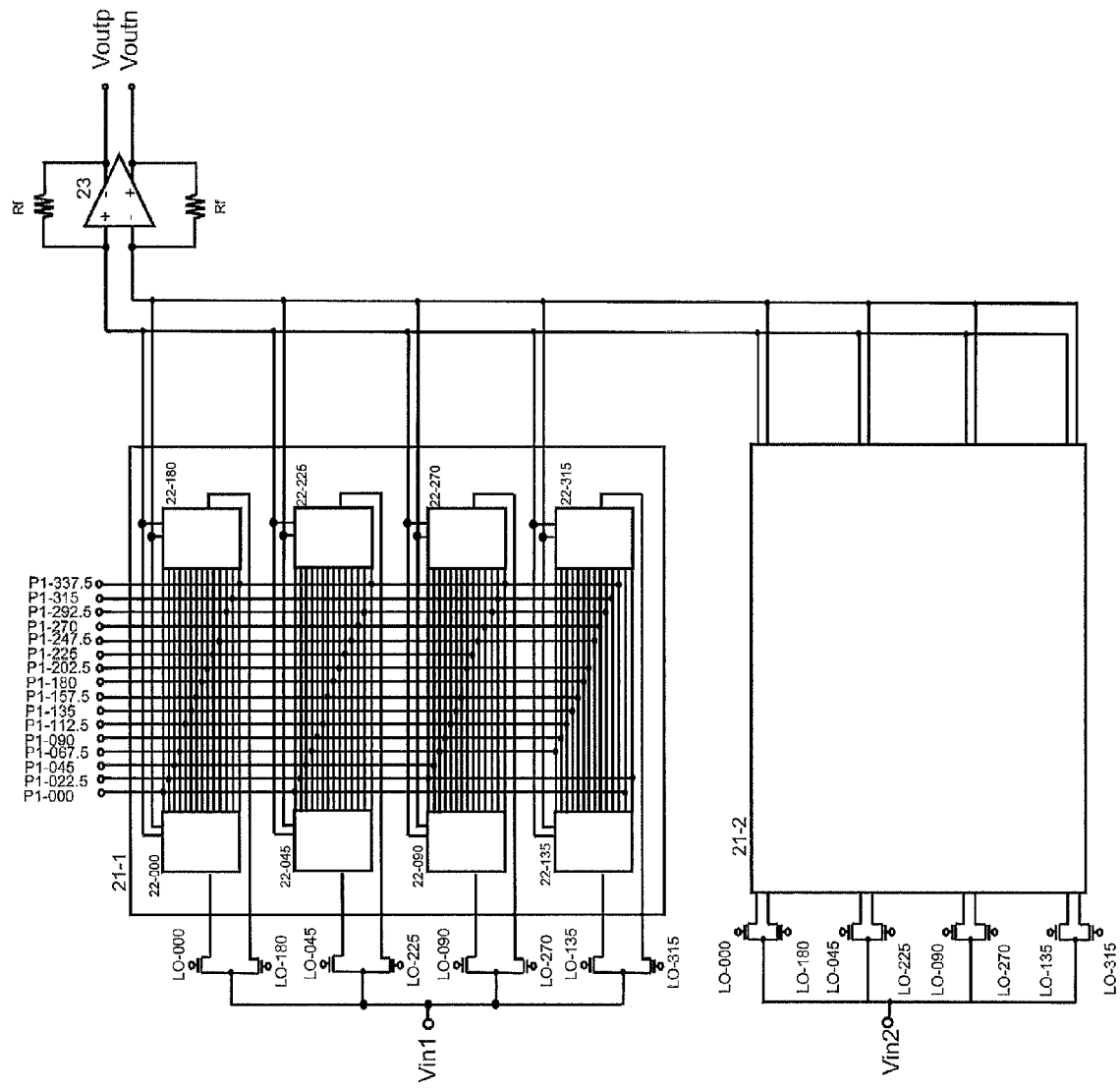
FIG. 18 is a block diagram of HRM according to Embodiment 4 of the present invention.

A configuration example of HRM 20-1 will be described. FIG. 18 is a block diagram of HRM 20-1.

In FIG. 18, HRM 20-1 includes output selection sections 21-1 and 21-2 instead of output selection sections 18-1 and 18-2. Output signal selection sections 21-1 and 21-2 have the same configuration. Output signals of output selection sections 21-1 and 21-2 are outputted to the Voutp terminal and Voutn terminal via operational amplifier (hereinafter referred to as "OP") 23. OP 23 has a configuration using feedback resistors Rf. Hereinafter, output signal selection section 21-1 will be described as an example.

Output signal selection section 21-1 includes a plurality of variable resistance sections 22. In FIG. 18, there are eight variable resistance sections 22, such as variable resistance sections 22-000 to 22-315. Here, variable resistance section 22-000 will be described as an example. Variable resistance section 22-000 receives a signal from a passive mixer, to a gate of which an LO-000 signal is inputted. Variable resistance section 22-000 selects a signal based on a phase selection signal such as P1-000 signal, P1-022.5 signal, P1-045 signal, P1-067.5 signal, P1-090 signal, P1-112.5 signal, P1-135 signal, P1-157.5 signal, P1-180 signal, P1-202.5 signal, P1-225 signal, P1-247.5 signal, P1-270 signal, P1-292.5 signal, P1-315 signal and P1-337.5 signal. Variable resistance section 22-000 then outputs the selected signal to the Voutp terminal and Voutn terminal via OP 23. Similarly, variable resistance sections 22-045 to 22-315 also select a signal based on a phase selection signal connected as shown in the drawing and outputs the selected signal to the Voutp terminal and Voutn terminal via OP 23.

The configuration of HRM 20-1 has been described as an example, and since the same applies to HRM 20-2, description thereof will be omitted here. However, HRM 20-2 is different from HRM 20-1 in the arrangement of the P1-000 to 315 terminals, which is a configuration with terminals phase-shifted from one another by 90 degrees.

<Configuration of Variable Resistance Section 22>

Figure 19:
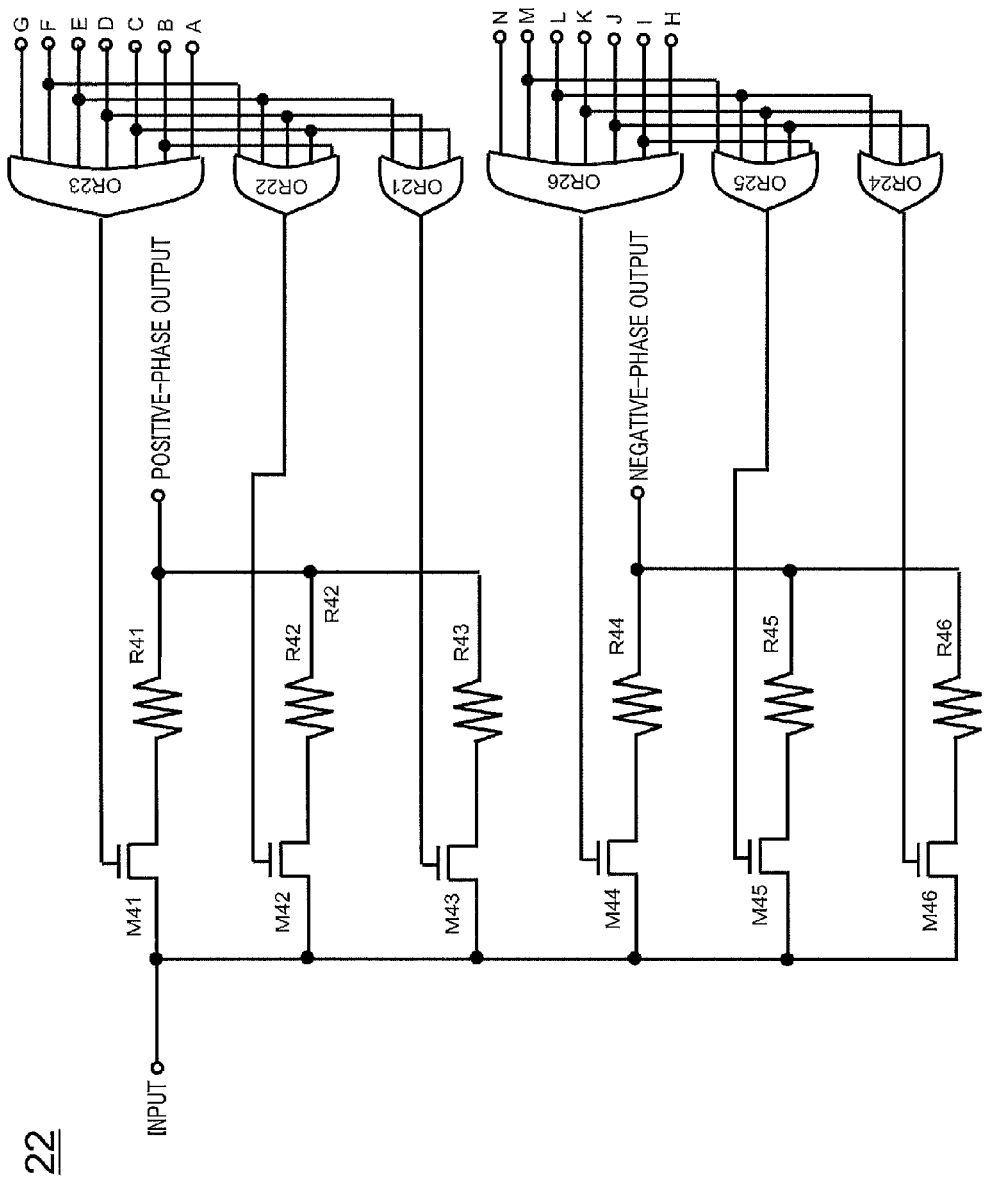
FIG. 19 is a configuration diagram of a variable resistance section according to Embodiment 4 of the present invention.

A configuration example of variable resistance section 22 will be described. FIG. 19 is a configuration diagram of variable resistance section 22. Variable resistance section 22 described here is any one of variable resistance sections 22-000 to 22-315 shown in FIG. 18.

Variable resistance section 22 includes an input terminal connected to a passive mixer, a positive-phase output terminal connected to the positive-phase input terminal of OP 23, and a negative-phase output terminal connected to the negative-phase input terminal of OP 23. The input terminal is connected to the sources of resistor changeover switches M41 to 46 made up of NMOS transistors.

The drain of resistor changeover switch M41 is connected to resistor R41. The drains of resistor changeover switches M42 to 46 are connected to resistors 42 to 46. The terminals of resistors R41 to 43 not connected to resistor changeover switches M41 to M43 are connected to the positive-phase output terminal. The terminals of resistors R44 to 46 not connected to resistor changeover switches M44 to M46 are connected to the negative-phase output terminal.

The resistance ratio between resistors R41, R42 and R43 is 2:3:3. The resistance ratio between resistors R44, R45 and R46 is also 2:3:3. The gains of variable resistance section 22 and OP 23 are proportional to Rf/(resistance value of the variable resistance section) and an amplitude-phase relationship of the output signal is equal to that in FIG. 16.

<Operational Effects of Receiver 400>

As described above, receiver 400 can obtain the same operational effects as those of receiver 100 and receiver 300.

In the present embodiment, an assumption is made that the number of local oscillation signals outputted from the multi-phase local oscillation signal generating section to be eight, but the number of local oscillation signals is not limited to this.

In the resent embodiment, the HRM configuration has been described, but frequency conversion that does not suppress harmonic interference without using any variable resistance section may also be adopted.

The present embodiment has been described with an example of the configuration of Embodiment 3 where an operational amplifier is used instead of a cascode amplifier, but the present invention is not limited to this example. For example, in the configuration of Embodiment 1 or 2, an operational amplifier may be used instead of the cascode amplifier.

The embodiments of the present invention have been described so far, but the above description is only an example and various modifications can be made thereto.

The disclosure of Japanese Patent Application No. 2013-037562, filed on Feb. 27, 2013, including the specification, drawings and abstract is incorporated herein by reference in its entirety.

INDUSTRIAL APPLICABILITY

The present invention is applicable to a technique of receiving a high-frequency signal used in a communication or broadcasting system and frequency-converting the signal to a baseband signal. The present invention is suitable for use in, for example, a TV tuner or portable terminal.

REFERENCE SIGNS LIST 1-1, 1-2 Antenna
2-1, 2-2 Low noise amplifier (LNA)
3-1, 3-2 Phase adjuster
4-1, 4-2 Frequency converter
5 Local oscillation signal generating section
6-1, 6-2 Frequency converter
7 Multi-phase local oscillation signal generating section
8-1, 8-2 Variable gain amplifier (VGA)
9-1, 9-2 Low pass filter (LPF)
10-1, 10-2 Analog-digital signal converter (ADC)
11 Phase selection signal generating section
12 Multi-phase local oscillation signal generating circuit
13 Reference local oscillation signal generating section
14-1, 14-2 Harmonic rejection mixer (HRM)
15-1, 15-2 Output signal selection section
16 Cascode amplification section
17-1, 17-2 Harmonic rejection mixer (HRM)
18-1, 18-2 Output signal selection section
19 Cascode amplification section
20-1, 20-2 Harmonic rejection mixer (HRM)
21-1, 21-2 Output signal selection section
22 Variable resistance section
23 OP
30 Digital signal processing section
100, 200, 300, 400, 500 Receiver

The invention claimed is:

1. A receiver comprising:
a multi-phase local oscillation signal generator that generates plural pairs of local oscillation signals of different phases;
a phase selection signal generator that generates a phase selection signal used to select a baseband signal of a predetermined phase, the phase selection signal being adjusted so as to increase a reception level of a high-frequency signal; and
a frequency converter that frequency-converts the high-frequency signal based on the plural pairs of local oscillation signals, that generates a plurality of baseband signals of different phases, and that selects a baseband signal from among the plurality of baseband signals based on the phase selection signal.

2. The receiver according to claim 1, wherein the frequency converter includes a first frequency converter and a second frequency converter each configured to receive the high-frequency signal, wherein
the frequency converter combines a baseband signal selected by the first frequency converter and a baseband signal selected by the second frequency converter and outputs the combined baseband signal.

3. The receiver according to claim 1, wherein the frequency converter is a harmonic rejection mixer that suppresses frequency conversion of a harmonic wave at an odd number multiple of frequencies of the plural pairs of local oscillation signals.

4. The receiver according to claim 1, wherein the multi-phase local oscillation signal generator generates the plural pairs of local oscillation signals having a phase difference of 45 degrees or 22.5 degrees.

5. The receiver according to claim 1, wherein the frequency converter selects the baseband signal based on the phase selection signal using a cascode amplifier.

6. The receiver according to claim 1, wherein the frequency converter selects the baseband signal based on the phase selection signal using a variable resistor connected to an input end of an operational amplifier.

* * * * *